(12) United States Patent
Maliakal

(10) Patent No.: US 7,369,396 B2
(45) Date of Patent: May 6, 2008

(54) COMPOSITE ELECTROACTIVE MATERIAL FOR ELECTROMECHANICAL ACTUATORS

(75) Inventor: Ashok Maliakal, Westfield, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 11/176,722

(22) Filed: Jul. 7, 2005

(65) Prior Publication Data

US 2007/0008675 A1    Jan. 11, 2007

(51) Int. Cl.
 *H01G 4/06* (2006.01)
 *H01G 5/00* (2006.01)
(52) U.S. Cl. .................................... 361/311; 361/277
(58) Field of Classification Search ................ 361/311, 361/321.1, 277, 281; 428/403
 See application file for complete search history.

(56) References Cited

U.S. PATENT DOCUMENTS

| 4,171,410 | A | * | 10/1979 | Frob | 521/52 |
| 5,548,474 | A | * | 8/1996 | Chen et al. | 361/313 |
| 6,272,003 | B1 | * | 8/2001 | Schaper | 361/306.2 |
| 2002/0192476 | A1 | * | 12/2002 | Kambe et al. | 428/447 |
| 2005/0095448 | A1 | | 5/2005 | Katz et al. | 428/689 |

FOREIGN PATENT DOCUMENTS

JP    2005142143 A   *   6/2005

OTHER PUBLICATIONS

"Low-Temperature Synthesis of Soluble and Processable Organic-Capped Anatase $TiO_2$ Nanorods," by P. Davide Cozzoli, et al., Journal of the American Chemical Society, v. 125, 2003, pp. 14539-14548.

"Synthesis of Monodisperse Nanoparticles of Barium Titanate: Toward a Generalized Strategy of Oxide Nanoparticle Synthesis," by Stephen O'Brien, et al., Journal of the American Chemical Society, v. 123, 2001, pp. 12085-12086.

"Giant Electrostriction and Relaxor Ferroelectric Behavior in Electron-Irradiated Poly(vinylidene fluoride-trifluoroethylene) Copolymer," by Q.M. Zhang, et al., Science, V. 280, 1998, pp. 2101-2104.

"An All-Organic Composite Actuator Material With A High Dielectric Constant," by Q.M. Zhang, et al., Nature, v. 419, 2002, pp. 284-287.

"All-Organic Dielectric-Percolative Three-Component Composite Materials With High Electromechanical Response," by Cheng Huang, et al., Applied Physics Letters, v. 84, 2004, pp. 4391-4393.

"High-Speed Electrically Actuated Elastomers With Strain Greater Than 100%," by Ron Pelrine, et al., Science, v. 287, 2000, pp. 836-839.

"Synthesis of Nanocomposite Organic/Inorganic Hybrid Materials Using Controlled/"Living" Radical Polymerization," by Jeffrey Pyun, et al., Journal of the American Chemical Society, v. 13, 2001, pp. 3436-3448.

* cited by examiner

*Primary Examiner*—Eric Thomas

(57) ABSTRACT

A composite electroactive material having a plurality of particle cores, each particle core surrounded by a polymer covering having one or more strands of an electroactive polymer. In one embodiment, the particle cores have a relatively small size, e.g., between about 10 and 50 nm, and include a material having a relatively large dielectric constant, e.g., greater than about 30. Each polymer strand includes an electroactive elastomer that is bonded to the surface of the corresponding particle core by a linker. Representative examples of the particle core material, elastomer, and linker are titanium dioxide, polybutadiene, and a phosphonate group, respectively.

22 Claims, 8 Drawing Sheets

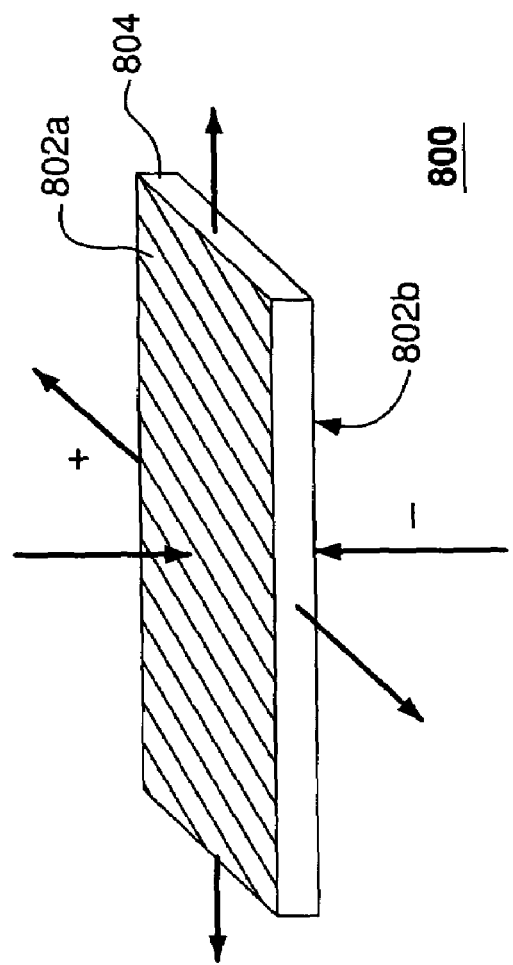
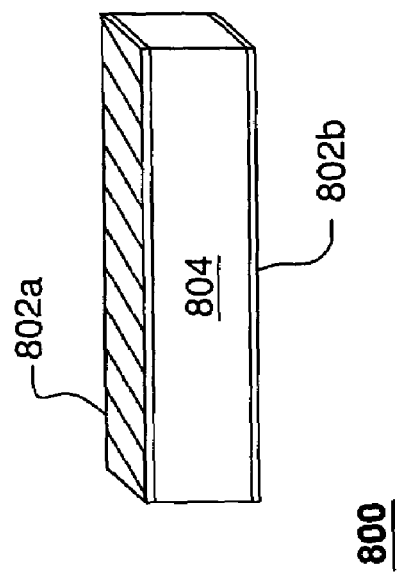
FIG. 8B
FIG. 8A

COMPOSITE ELECTROACTIVE MATERIAL FOR ELECTROMECHANICAL ACTUATORS

BACKGROUND OF THE INVENTION

1. Field of the Invention

The present invention relates to electromechanical actuators, materials for electromechanical actuators, and methods of making electromechanical actuators.

2. Description of the Related Art

High-performance actuator materials capable of converting electrical energy into mechanical energy are needed for a wide range of applications including, but not limited to, mini- and micro-robots, micro air vehicles, flat-panel loudspeakers, micro-electromechanical systems (MEMS), and micro-fluidic devices. Actuator-material development goals include achieving a large range of motion with high precision and speed for meeting application requirements, high elastic energy density for robustness, and a low fatigue rate for durability and reliability. Although there are several actuator materials that are currently available, there are few, if any, that come close to meeting all of these goals.

Electroactive polymers (EAPs) attract much attention in the field of high-performance actuator materials because of their relatively low cost and ability to be tailored to particular applications. In particular, EAPs that are controlled by external electrical fields (generally referred to as field-type EAPs) have been demonstrated to exhibit relatively fast response speeds, low hysteresis, and high strain levels (e.g., greater than about 100%) that are far above those of traditional piezoelectric materials (e.g., piezoceramics). However, prior-art field-type EAPs also require relatively high electric fields, e.g., on the order of 100 V/μm, to generate usable elastic energy densities.

The elastic energy density is a key parameter, related to both the stress and strain generation capability of an actuator material. For example, for a material having linear dielectric and elastic properties, the stored elastic energy density, $U_s$, can be expressed as follows:

$$U_s = \frac{1}{2}YS^2 = \frac{(K\varepsilon_0 E^2)^2}{2Y} \quad (1)$$

where Y is the Young's modulus, S is the strain, K is the material's dielectric constant, E is the electric field, and $\varepsilon_0$ is the vacuum dielectric permittivity (=$8.85\times10^{-12}$ F/m). Since, for most EAPs, the dielectric constant K is relatively small (typically less than about 10), relatively high electric fields are required for the generation of desirable elastic energy densities.

SUMMARY OF THE INVENTION

Problems in the prior art are addressed, in accordance with the principles of the present invention, by a composite electroactive material having a polymer matrix and a plurality of particle cores dispersed therein. In one representative embodiment, the particle cores have a relatively small size, e.g., between about 10 and 50 nm, and include a material having a relatively large dielectric constant, e.g., greater than about 30. The polymer matrix comprises polymer strands, each having an electroactive elastomer that is bonded to the surface of the corresponding particle core by a linker. Representative examples of the particle core material, elastomer, and linker are titanium dioxide, polybutadiene, and a phosphonate group, respectively. Advantageously, embodiments of the composite electroactive material of the invention provide higher elastic energy densities than prior-art materials at the same electric field or, alternatively, the same elastic energy densities as prior-art materials at lower electric fields. In addition, by appropriately selecting materials, sizes, and fractional volumes for the particle cores and polymer strands, respectively, the composite electroactive material of the invention can be tailored to a specific application.

According to one embodiment, the present invention is an apparatus comprising: first and second electrodes; and a layer of an electroactive material located between the electrodes, wherein the electroactive material comprises a plurality of particle cores, each particle core surrounded by a polymer covering having one or more strands of an elastomeric polymer, the particle cores having linear dimensions smaller than about 0.5 micron.

According to another embodiment, the present invention is an electroactive material comprising a plurality of particle cores, each particle core surrounded by a covering having one or more strands of an elastomeric polymer, the particle cores having linear dimensions smaller than about 0.5 micron.

According to yet another embodiment, the present invention is an apparatus comprising: first and second electrodes; and a layer of an electroactive material located between the electrodes, wherein the electroactive material comprises a plurality of particle cores, each particle core surrounded by a polymer covering having one or more strands of an elastomeric polymer, wherein one or more of said strands are chemically bonded to the particle core.

BRIEF DESCRIPTION OF THE DRAWINGS

Other aspects, features, and benefits of the present invention will become more fully apparent from the following detailed description, the appended claims, and the accompanying drawings in which:

FIGS. 8A-B show perspective three-dimensional views of an electromechanical actuator according to one embodiment of the invention.

DETAILED DESCRIPTION

U.S. patent application Ser. No. 10/700,651, filed Nov. 4, 2003, entitled "Layer Incorporating Particles with a High Dielectric Constant," and published as U.S. Patent Application Publication No. 2005/0095448 is incorporated herein by reference in its entirety.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

Electroactive Material

To reduce the electric field substantially, while retaining the high elastic energy density required for many applications, a polymer-based material is needed that has a relatively high dielectric constant. One approach to producing an electroactive material having a relatively large dielectric constant is to create a composite material by mixing an electroactive polymer (EAP) with a high-dielectric-constant inorganic-particulate filler. However, for several reasons, it is difficult to obtain a high-performance composite electroactive material by plain mechanical mixing. For example, finely dispersed inorganic fillers typically undergo aggregation and coagulation, which impose a lower bound (e.g., of about 1 µm) on the particle-size distribution in the filler, i.e., particles having a size that is smaller than the lower bound are substantially absent in the filler. Due to this lower bound, a mechanically mixed composite material includes relatively large particles, which have mechanical properties substantially similar to those of the bulk filler material. Since most filler materials (typically ceramics) have elastic moduli that are much higher than those of EAPs, the resulting composite material is typically substantially stiffer than the original EAP standing alone. As apparent from Eq. (1), the increased stiffness of the composite material detrimentally affects the elastic energy density and, in most cases, the gain in the elastic energy density due to the higher effective dielectric constant is completely negated by the loss in the elastic energy density due to the increased stiffness. Also, composite materials with such large particles would not typically be useful for making very thin smooth films, e.g., films having a thickness of less than about 1 µm.

Figure 1:
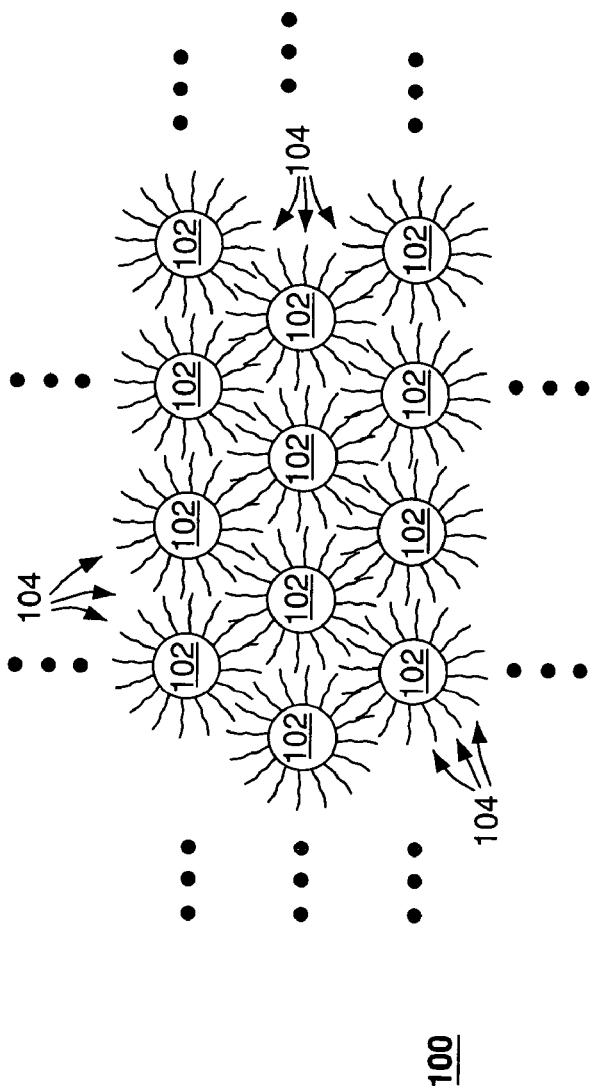
FIG. 1 schematically shows a composite electroactive material according to one embodiment of the invention.

FIG. 1 schematically shows a composite electroactive material 100 according to one embodiment of the invention. More specifically, material 100 is a substantially homogeneous (pseudo-homogeneous) material having a uniform distribution of particle cores 102, where each particle core is surrounded by a covering having one or more elastomeric polymer strands 104. In one embodiment, one or more strands 104 are chemically bonded to the corresponding particle core(s).

Particle cores 102 have a relatively small size, e.g., smaller than about 0.5 µm, and preferably a largest particle-core dimension between about 10 and 50 nm, and include a material having a relatively large dielectric constant, e.g., greater than about 30. Particle cores 102 may have a variety of shapes, e.g., spherical, elongated, or irregular, and a variety of sizes. In a representative embodiment, material 100 has a particle concentration of between about $10^{14}$ and $10^{18}$ particles/cm$^3$. Table 1 provides a list of representative materials that can be used to form particle cores 102 according to various embodiments of the invention.

TABLE 1

List of Representative Materials for Particle Cores 102 and Their Respective Dielectric Constants

| Material | Dielectric Constant |
|---|---|
| Barium Sodium Niobate | 32-235 |
| Barium Oxide | 34 |
| Barium Titanate | 80-3600 |
| Barium Titanium Niobate | 190-220 |
| Cadmium Pyroniobate | 500-580 |
| Potassium Niobate | 700 |
| Potassium Strontium Niobate | 800-1200 |
| Potassium Tantalate | 242 |
| Manganese Oxide | 10000 |
| Lead Magnesium Niobate | 10000 |
| Lead Sulfide | 190-200 |
| Lead Selenide | 280 |
| Lead Telluride | 450 |
| Antimonous Selenide | 110 |
| Tin Telluride | 1770 |
| Stronium Titanate | 332 |
| Titanium Oxide | 30-110 |

While the polymer covering may or may not be fully continuous around each associated particle core 102, the polymer coverings of different particle cores taken together form a polymer matrix between the particle cores. This matrix substantially prevents particles cores 102 from aggregating and phase-separating, insulates different particle cores from one another, and fills the volume between the particle cores such that even a relatively thin (e.g., about 0.1 µm) layer of material 100 has a relatively smooth surface.

As already indicated above, some of polymer strands 104 may be chemically bonded (e.g., at one end) to the outer surface of the associated particle core 102. The chemical bonds may be moderate to strong covalent bonds, hydrogen bonds, or coordination bonds. Polymer strands 104 of one core may have a distribution of lengths or substantially the same length. In one embodiment, polymer strands 104 have degree of polymerization between about 20 and 200 (alternatively molecular weights between approximately 2000 and 20,000 amu). Polymer strands 104 may form a substantially continuous coating around the associated particle core 102 or a partial coating that has one or more openings. Polymer strands 104 of adjacent cores may partially interdigitate and interact rather strongly via attractive van-der-Waals forces, physical hooking, entanglement, and/or chemical cross linking. Such interactions between polymer strands 104 can advantageously stabilize the entire structural matrix of material 100 and provide robustness and integrity to the material.

Material 100 is an electroactive material because strands 104 are electroactive. In one embodiment, the size and composition of and fractional volume occupied by particle cores 102 are selected such that material 100 has (i) an elastic modulus that does not exceed the elastic modulus of the corresponding polymer by more than about 100% and (ii) a dielectric constant that is greater than about 10. In a representative embodiment, particle cores 102 occupy at least 10% of the total volume in material 100 and typically occupy 20-40% or more. In an embodiment, where particle cores 102 occupy a relatively small fraction (e.g., about 10%) of the total volume, the particle cores are formed of a material having a relatively large (e.g., greater than about 80) dielectric constant. Due to the above-outlined properties, embodiments of material 100 advantageously provide higher elastic energy densities than prior-art materials at the same electric field or, alternatively, the same elastic energy densities as prior-art materials at lower electric fields. In addition, by appropriately selecting materials, sizes, and fractional volumes for particle cores 102 and polymer strands 104, respectively, material 100 can be tailored to a specific application.

Figure 2:
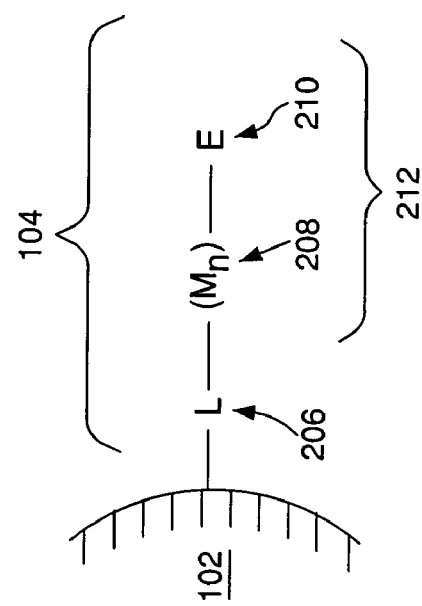
FIG. 2 schematically shows one polymer strand attached to the corresponding particle core in the material of FIG. 1 according to one embodiment of the invention.

FIG. 2 schematically shows one polymer strand 104 attached to the corresponding particle core 102 in material 100 according to one embodiment of the invention. More specifically, polymer strand 104 includes an elastomer 212, which is bonded to the surface of particle core 102 by a linker 206. Elastomer 212 generally includes (i) a polymer 208 having a chain of monomers M and (ii) one or more end groups 210. For illustration purposes, elastomer 212 is shown as having a single end group 210 labeled E in FIG. 2. In other embodiments, polymer 208 may have a branched structure, with each branch having a corresponding end group similar to group 210. Linker 206 is a chemical group that has (1) at least one chemical bond with the surface atom(s) of particle core 102 and (2) at least one chemical bond with elastomer 212. In one embodiment, elastomer 212 can be bonded by two or more linkers 206 to one or more particle cores 102. In another embodiment, elastomers 212 belonging to different polymer strands 104 can be cross-linked to increase mechanical stability.

Figure 3:
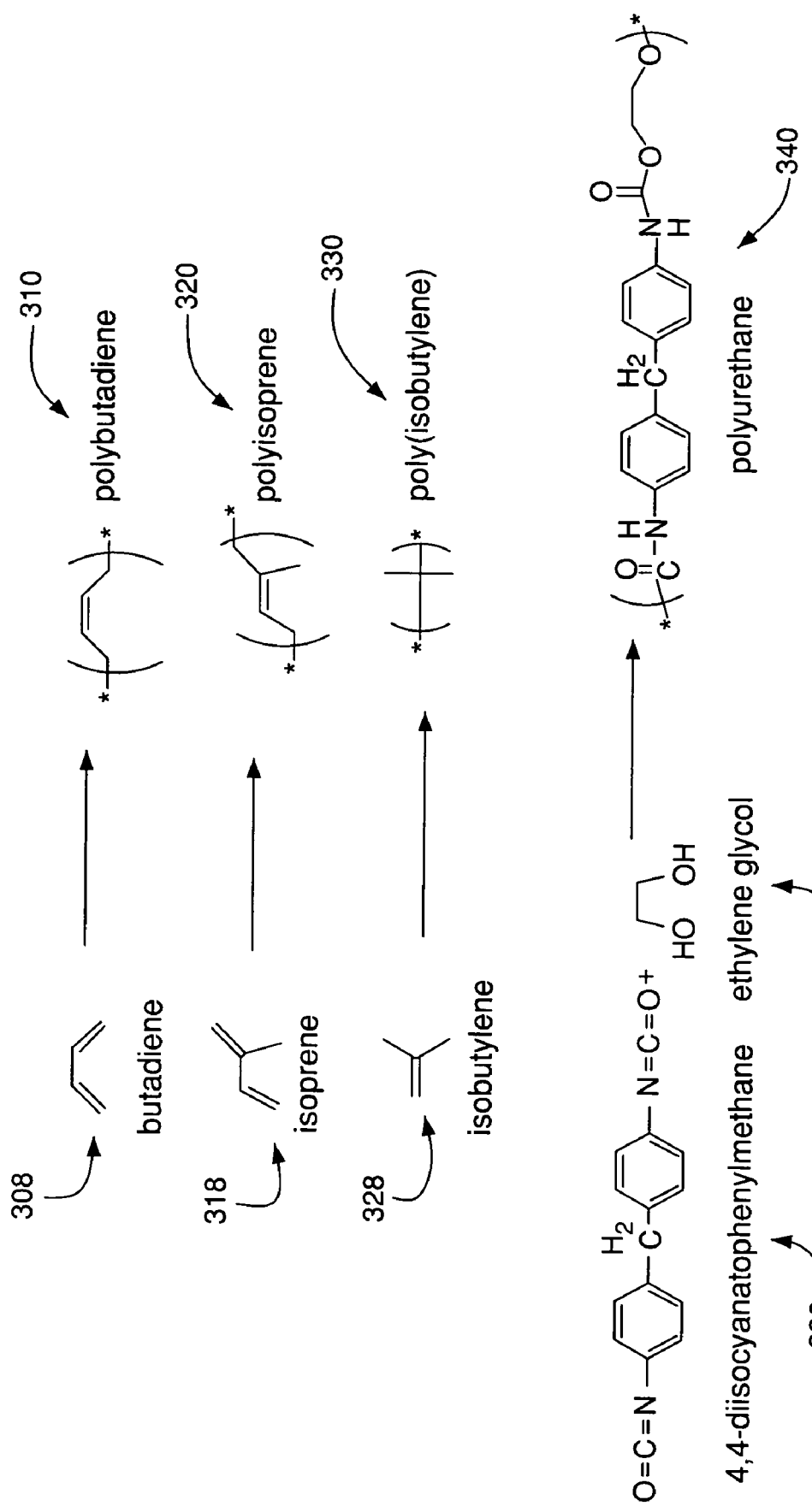
FIG. 3 shows chemical structures of exemplary monomers and polymers that can be used in the material of FIG. 1 according to various embodiments of the invention.

FIG. 3 shows chemical structures of exemplary polymers that can be used as polymer 208 according to various embodiments of the invention. In one embodiment, elastomer 212 incorporates polybutadiene 310 as polymer 208. A chemical precursor of polybutadiene 310 is butadiene 308. In another embodiment, elastomer 212 incorporates polyisoprene 320 as polymer 208. A chemical precursor of polyisoprene 320 is isoprene 318. In yet another embodiment, elastomer 212 incorporates polyisobutylene 330 as polymer 208. A chemical precursor of polyisobutylene 330 is isobutylene 328. In yet another embodiment, elastomer 212 incorporates polyurethane 340 as polymer 208. Chemical precursors of polyurethane 340 are 4,4-di-isocyanatophenylmethane 336 and ethylene glycol 338.

Figure 4:
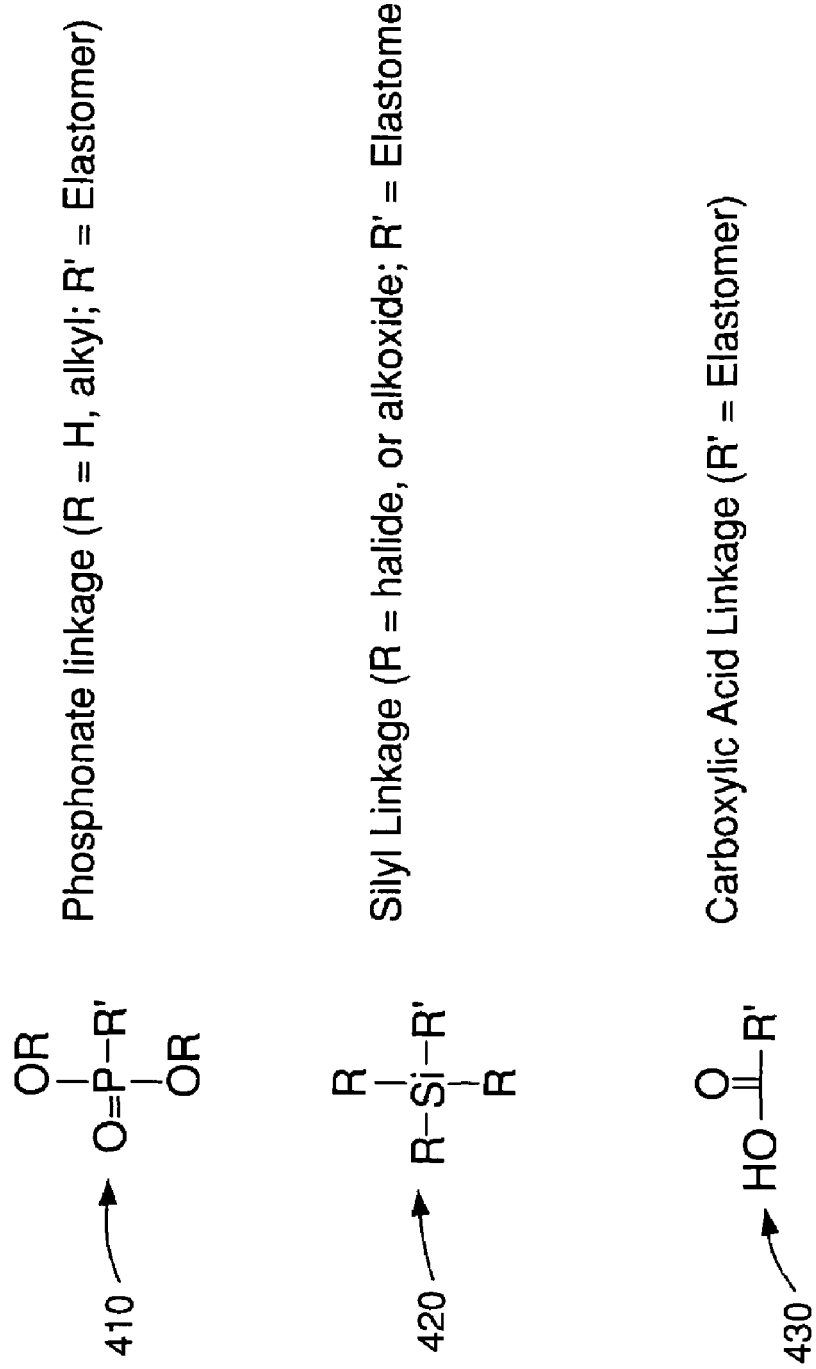
FIG. 4 shows chemical structures of exemplary chemical precursors that can be used to link polymer strands to particle cores in the material of FIG. 1 according to various embodiments of the invention.

FIG. 4 shows chemical structures of exemplary end-functionalized polymers chemical precursors that can be attached to particle cores 102 according to various embodiments of the invention. In one embodiment, strand 104 comprises a precursor 410 having a phosphonate linkage group with an elastomeric chain R' attached. Linkage to particle core 102 is accomplished primarily by reaction of surface atoms with the oxygen of the phosphorus-oxygen double bond, and possibly also through interactions between surface atoms and the other oxygen atoms in the phosphonate. A phosphonate linkage group similar to that in precursor 410 can be used, e.g., for linkage to inorganic oxides such as $TiO_2$ and $BaTiO_3$. In another embodiment, strand 104 has a structure similar to that of a precursor 420. In this embodiment, a silyl linkage group is produced by reaction of surface groups with the silicon atom of the precursor and displacement of halides or alkoxides from the precursor. A silyl linkage group similar to that in precursor 420 can be used, e.g., for linkage of strand 104 to inorganic oxides. In yet another embodiment, strand 104 is formed using a precursor 430 having a carboxylic-acid linkage group by removing the H atom from the linkage group and using the freed valence to form a chemical bond with a surface atom of particle core 102. A carboxylic-acid linkage group similar to that in precursor 430 can be used, e.g., for linkage of strand 104 to inorganic oxides and sulfides (see Table 1).

Figure 5:
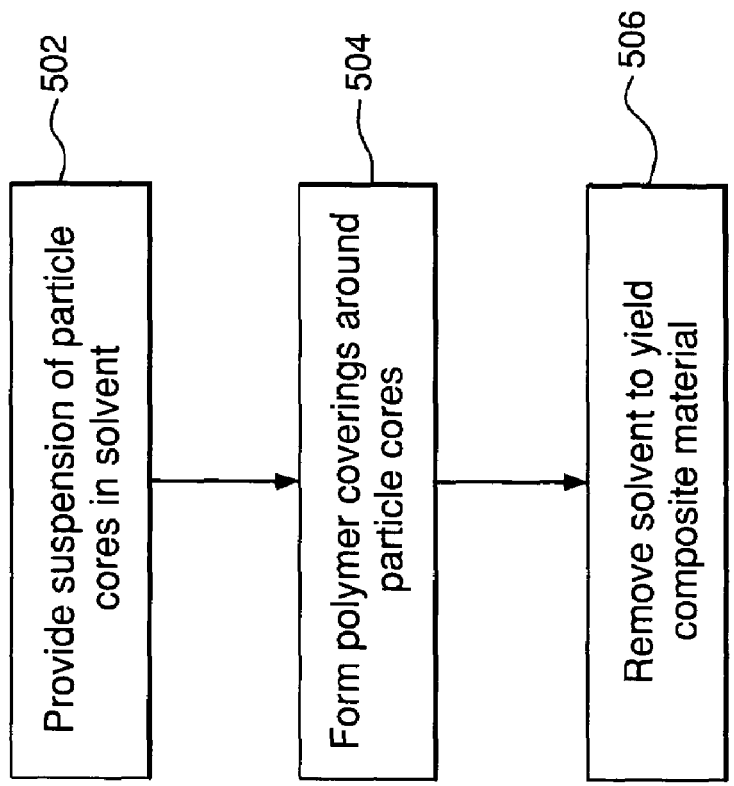
FIG. 5 shows a flowchart of a method of synthesizing the material of FIG. 1 according to one embodiment of the invention.

FIG. 5 shows a flowchart of a method 500 of synthesizing material 100 according to one embodiment of the invention. At step 502 of method 500, a stabilized dispersion of particle cores 102 having desired sizes is provided in a suitable solvent. Particle cores 102 are preferably grown in the solvent in situ, and the resulting dispersion contains a stabilizing agent that deters coagulation and aggregation of the particle cores.

At step 504 of method 500, polymer coverings having polymer strands 104 are formed around particle cores 102. In one embodiment, step 504 includes (i) appropriately functionalizing elastomer 212 by attaching a chemical precursor of linker group 206 to form a precursor of strand 104 and (ii) attaching strand(s) 104 via the linker group(s) to the surface of particle core 102 to form the polymer covering. In another embodiment, step 504 includes (i) appropriately functionalizing particle core 102 by attaching linker group (s) 206 and (ii) attaching elastomer(s) 212 to the corresponding linker group(s) 206 to form the polymer covering. In yet another embodiment, step 504 includes (i) appropriately functionalizing particle core 102 by attaching linker group (s) 206, which serve(s) as initiator site(s), and (ii) grow elastomer(s) 212 at the initiator site(s) using a surface-initiated polymerization process to form the polymer covering.

At step 506 of method 500, the solvent (and optionally unwanted solutes) are removed to yield material 100. In one embodiment, the solution containing suspended particle cores 102 with attached polymer strands 104 is subjected to (e.g., vacuum) evaporation, which removes the solvent and possibly other volatile components and precipitates material 100. In another embodiment, the solution is subjected to centrifugation, after which the solvent is decanted with the supernatant, whereas material 100 is collected from the remaining pellet.

Synthesis Examples

Step 502: In one embodiment, particle cores 102 are $TiO_2$ particle cores obtained commercially from Nanoproducts Corporation, 14330 Long Peak Court, Longmont, Colo., 80504, USA, as 20-30% dispersion by weight in methyl isobutyl ketone (MIK) or tetrahydrofuran (THF).

In another embodiment, $TiO_2$ particle cores 102 are obtained in a batch process as follows. Oleic acid (390 mL, Aldrich tech grade) is dried by heating to about 120° C. for about 1 hour under vigorous nitrogen bubbling, and then allowed to cool to about 100° C. Titanium (IV) isopropoxide (14.76 mL, 50 mmol, Aldrich 99.999%) is added to the acid. An aqueous solution of trimethylamine-N-oxide (TMAO) is made using 11.1 g of TMAO and 50 mL of water. This solution is rapidly added to the heated titanium (IV) isopropoxide/oleic acid mixture. The resulting mixture is then heated to 100° C. and maintained at that temperature for about 6 hours. After this heating time, the solution is allowed to cool to room temperature and poured into 1 liter of methanol. A fine white precipitate settles from solution. The supernatant is decanted. The wet slurry is washed several times with methanol (an additional 1 liter of methanol is used for the washing). After decanting most of the supernatant, the remaining wet slurry is centrifuged to remove most of the remainder of the methanol. The subsequent white solid is dried in a vacuum oven at room temperature for approximately 16 hours. Approximately 6 g of $TiO_2$ particle cores are recovered as a white powder, with the oleic acid covering the surface of the particle cores and acting as a stabilizing agent that deters coagulation. X-ray diffraction reveals that titanium dioxide in the particle cores belongs to the anatase phase.

In yet another embodiment, $TiO_2$ particle cores 102 having rod-like shapes are obtained using a process described by P. D. Cozzolli, et al., in the article published in the Journal of the American Chemical Society (JACS), 2003, v. 125, pp. 14539-48, the teachings of which are incorporated herein by reference.

In yet another embodiment, $BaTiO_3$ particle cores 102 are obtained using a process substantially similar to that described by S. O'Brien, et al., in the article published in JACS, 2001, v. 123, pp. 12085-86, the teachings of which are incorporated herein by reference.

Figure 6:
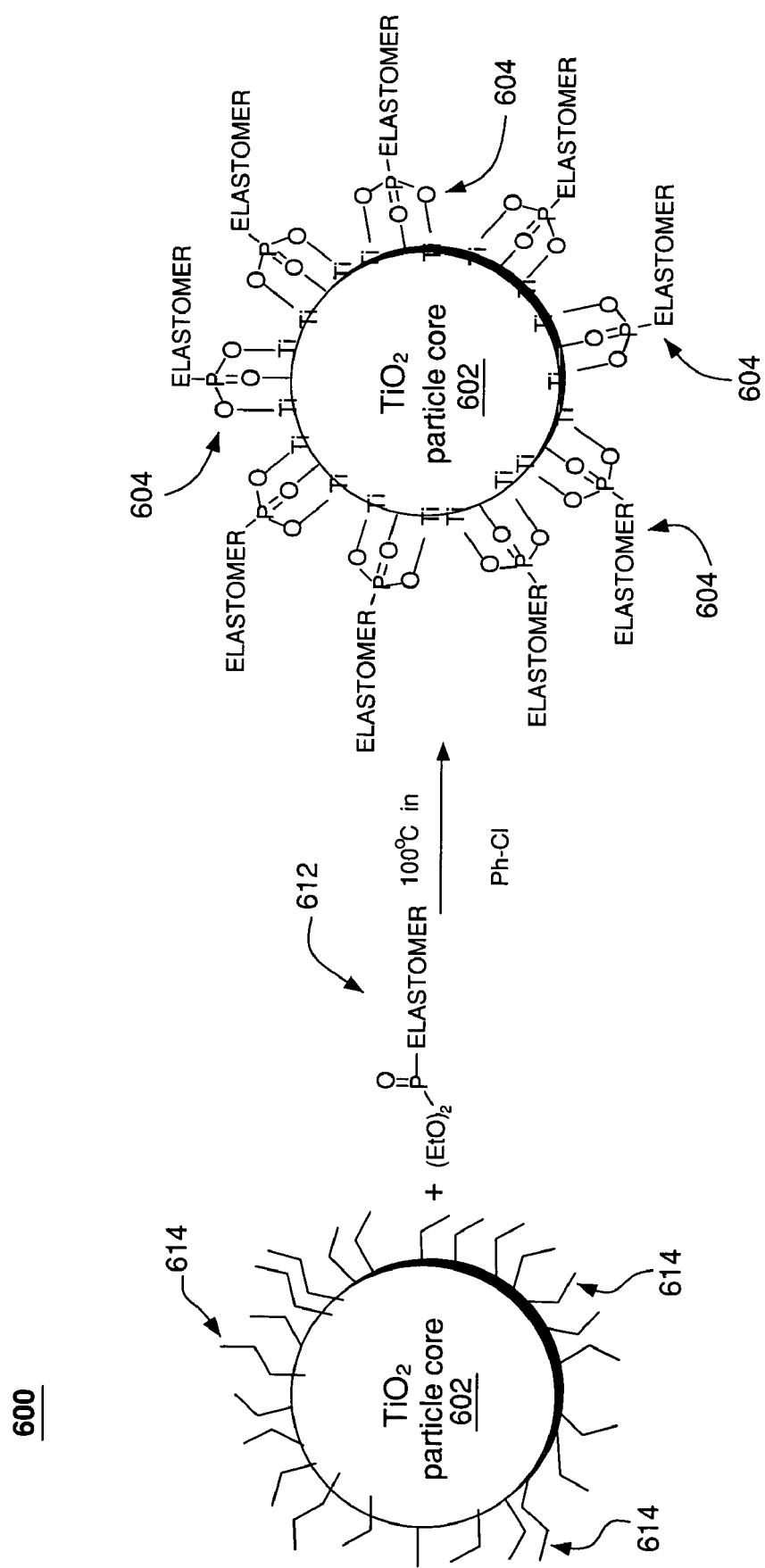
FIG. 6 schematically shows a process that can be used at the step of forming polymer shells around particle cores in the method shown in FIG. 5 according to one embodiment of the invention.

Step 504: FIG. 6 schematically shows a process 600 that can be used at step 504 of method 500 according to one embodiment of the invention. More specifically, $TiO_2$ particle cores 602 (only one of which is illustratively shown in FIG. 6) covered with oleic acid 614, obtained, e.g., as described above, are dispersed in chlorobenzene. An end-functionalized elastomer 612 is added to the dispersion. In the embodiment illustrated in FIG. 6, the end-functional-group, which serves as a chemical precursor to the linker analogous to linker 206 of FIG. 2, is a phosphonate group. The resulting reaction mixture is then heated to about 100° C. and maintained at that temperature for 24 hours, during which time the phosphonate group replaces oleic acid 614 at the surface of particle core 602 to produce a polymer strand 604 analogous to polymer strand 104 of FIGS. 1 and 2, with multiple polymer strands 604 forming a polymer shell for particle core 602.

Figure 7:
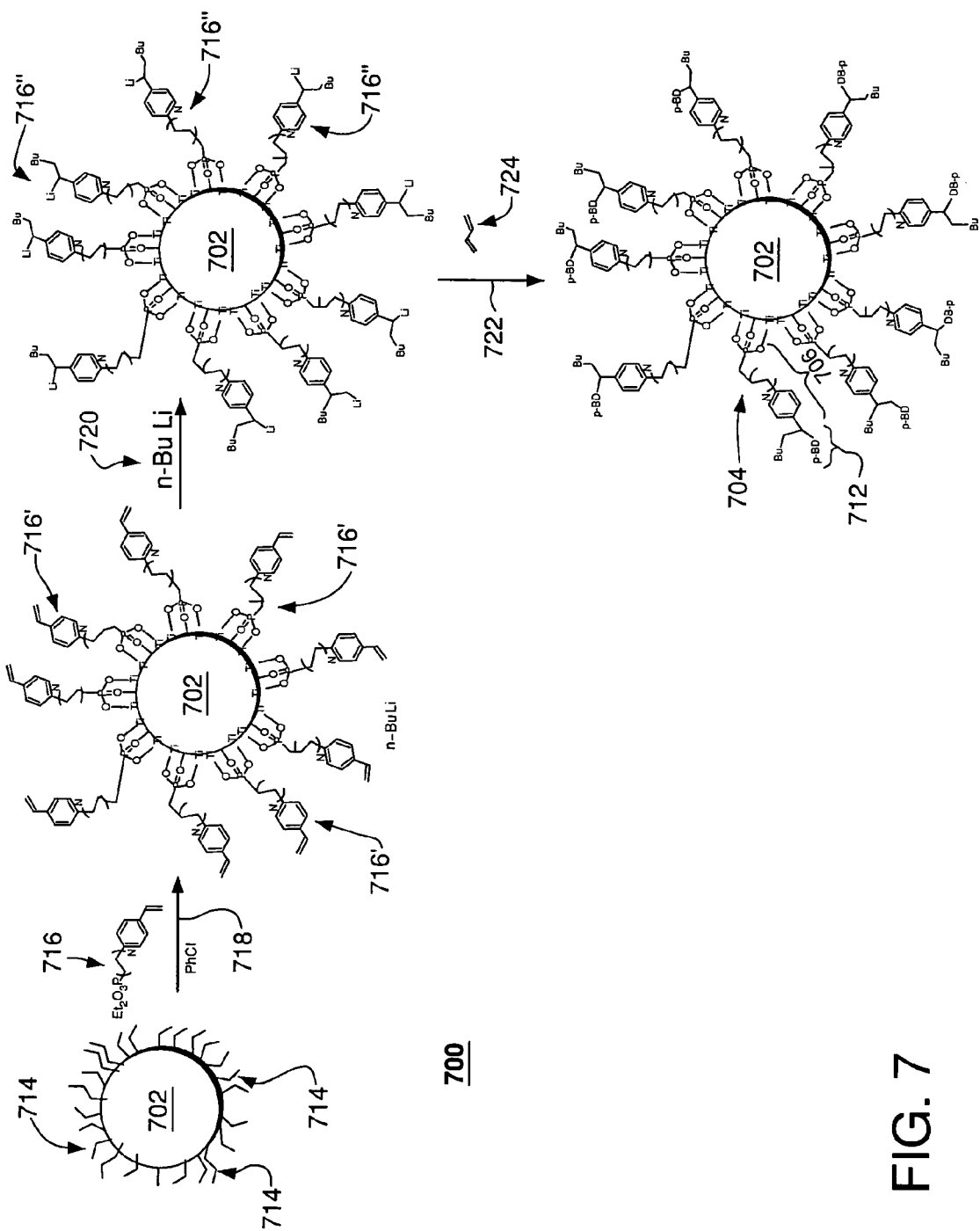
FIG. 7 schematically shows a process that can be used at the step of forming polymer shells around particle cores in the method shown in FIG. 5 according to another embodiment of the invention.

FIG. 7 schematically shows a process 700 that can be used at step 504 of method 500 according to another embodiment of the invention. More specifically, $TiO_2$ particle cores 702 (only one of which is illustratively shown in FIG. 7) covered with oleic acid 714 are dispersed in chlorobenzene, and an initiator 716 is added to the dispersion. A ligand-exchange reaction 718 is performed to replace oleic acid 714 by initiator 716, which becomes bonded to the surface of particle core 702 via the initiator's phosphonate group. Reaction 718 produces a dispersion containing particle cores 702 coated with an initiator 716'. n-Bulithium 720 is then added to this dispersion. n-Bulithium 720 reacts with an end group of initiator 716' to produce a modified initiator 716" having an alkyllithium end group. A surface-initiated polymerization reaction 722 is then performed by the addition of butadiene 724 to the dispersion. Reaction 722 produces a dispersion of particle cores 702 having attached polymer strands 704, with each polymer strand having a linker 706 and a polybutadiene (p-BD) elastomer 712.

Electromechanical Actuator

FIGS. 8A-B show perspective three-dimensional views of an electromechanical actuator 800 according to one embodiment of the invention. More specifically, FIG. 8A shows actuator 800 in a neutral (non-actuated) state, and FIG. 8B shows actuator 800 in an actuated state. Actuator 800 has two compliant electrodes 802a-b and a layer 804 of composite electroactive material 100 to which the electrodes are physically attached. Electrodes 802a-b and layer 804 form substantially a parallel-plate capacitor. When a voltage differential is applied between electrodes 802a-b, the resulting electrostatic forces compress and stretch layer 804 as indicated by the arrows in FIG. 8B. Reduction in the thickness of layer 804 brings oppositely charged electrodes 802a-b closer together, whereas transverse stretching of the layer stretches the electrodes and spreads similar charges on each of the electrodes over a larger area. Both changes in the shape of actuator 800 convert electrical energy into mechanical energy and provide an actuation mechanism for the actuator. For example, the thickness reduction can be used to produce a displacement in one direction, while the transverse stretching can be used to produce a displacement in at least a second direction. When the voltage differential is removed, actuator 800 returns into the neutral state shown in FIG. 8A. In one embodiment, electrodes 802a-b are made of conductive carbon grease, which is commercially available from ITW Chemtronics of Kennesaw, Ga.

Figures 9A, 9B, 9C:
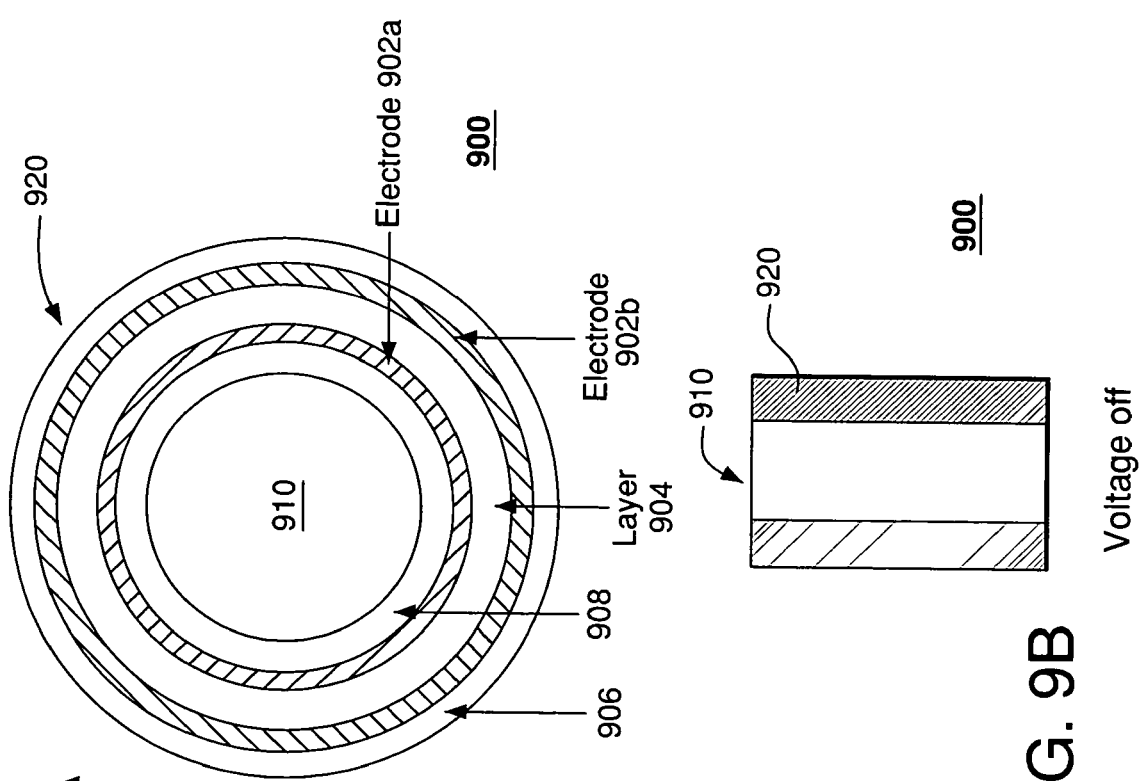
FIGS. 9A-C show cross-sectional views of an electromechanical actuator according to another embodiment of the invention.

FIGS. 9A-C show cross-sectional views of an electromechanical actuator 900 according to another embodiment of the invention. More specifically, FIGS. 9A-B show actuator 900 in a non-actuated state, and FIG. 9C shows actuator 900 in an actuated state, with FIGS. 9A and 9B-C showing radial and axial cross-sections, respectively. Actuator 900 has a shape of a hollow tube having an interior channel 910 surrounded by a generally cylindrical wall 920. Wall 920 has two compliant electrodes 902a-b and a layer 904 of composite electroactive material 100 located between the electrodes. Wall 920 also has two optional dielectric layers 906 and 908 located at the outer and inner surfaces, respectively. When a voltage differential is applied between electrodes 902a-b, the resulting electrostatic forces deform layer 904 such that the diameter of wall 920 is reduced and the wall is stretched in the axial direction, as illustrated by FIGS. 9B-C. If channel 910 is filled with a fluid, then the deformation of the tube propels the fluid out of the channel as shown by the arrows in FIG. 9C. When the voltage differential is removed, actuator 900 returns into the state shown in FIG. 9B. In one embodiment, actuator 900 can be appropriately connected to input and output ports and configured with valves to form a micro-fluidic pump.

While this invention has been described with reference to illustrative embodiments, this description is not intended to be construed in a limiting sense. For example, different types of elastomeric polymers and EAPs, such as dielectric polymers, ferroelectric polymers, and various polymer mixtures and/or copolymers, can be used in material 100. Additional description of these polymers can be found, e.g., in the following articles: (1) Q. M. Zhang, et al., Science, 1998, v. 280, p. 2101; (2) Q. M. Zhang, et al., Nature, 2002, v. 419, p. 284; (3) C. Huang, et al., Applied Phys. Letters, 2004, v. 84, p. 4391; (4) R. Perline, et al., Science, 2000, v. 287, p. 836, the teachings of all of which are incorporated herein by reference. Additional description of alternative polymerization techniques that can be used at step 504 of method 500 can be found, e.g., in the article by J. Pyun, et al., Chem. Mater., 2001, v. 13, p. 3436, the teachings of which are incorporated herein by reference. In one embodiment, material 100 may have (i) particle cores having a distribution of sizes such that the standard deviation of the distribution is not greater than 50% of the median size and (ii) polymer strands having a polydispersity that is no greater than about 1.2. Various modifications of the described embodiments, as well as other embodiments of the invention, which are apparent to persons skilled in the art to which the invention pertains are deemed to lie within the principle and scope of the invention as expressed in the following claims.

For the purposes of this specification, a MEMS device is a device having two or more parts adapted to move relative to one another, where the motion is based on any suitable interaction or combination of interactions, such as mechanical, thermal, electrical, magnetic, optical, and/or chemical interactions. MEMS devices are fabricated using micro- or smaller fabrication techniques (including nano-fabrication techniques) that may include, but are not necessarily limited to: (1) self-assembly techniques employing, e.g., self-assembling monolayers, chemical coatings having high affinity to a desired chemical substance, and production and saturation of dangling chemical bonds and (2) wafer/material processing techniques employing, e.g., lithography, chemical vapor deposition, patterning and selective etching of materials, and treating, shaping, plating, and texturing of surfaces. The scale/size of certain elements in a MEMS device may be such as to permit manifestation of quantum effects. Examples of MEMS devices include, without limitation, NEMS (nano-electromechanical systems) devices, MOEMS (micro-opto-electromechanical systems) devices, micromachines, Microsystems, and devices produced using microsystems technology or microsystems integration.

What is claimed is:

1. An apparatus, comprising:
   first and second electrodes; and
   a layer of an electroactive material located between the electrodes, wherein:
      the electroactive material comprises a plurality of particle cores, each particle core surrounded by a polymer covering having one or more strands of an elastomeric polymer, the particle cores having linear dimensions smaller than about 0.5 micron; and
      the layer is bound in a manner that enables a layer thickness to respond to application of a voltage differential between the first and second electrodes.

2. The invention of claim 1, wherein:
   the first and second electrodes and the layer have substantially cylindrical shapes that define an inner channel; and
   the apparatus is adapted to propel fluid along the channel in response to the application of the voltage differential.

3. The invention of claim 1, wherein the first and second electrodes form a parallel-plate capacitor.

4. The invention of claim 1, wherein the layer is in contact with the first and second electrodes.

5. The invention of claim 1, wherein the electroactive material has a dielectric constant greater than about 10.

6. The invention of claim 1, wherein the particle cores comprise a material having a dielectric constant of at least about 30.

7. The invention of claim 1, wherein the particle cores occupy at least about 10% of the total volume in the electroactive material.

8. The invention of claim 1, wherein the particle cores have sizes between about 10 and 100 nm.

9. The invention of claim 1, wherein the particle cores comprise at least one of a metal niobate, a metal oxide, a metal titanate, a metal tantalite, a metal sulfide, a metal selenide, and a metal telluride.

10. The invention of claim 1, wherein each polymer strand comprises an elastomer, which is chemically bonded to the corresponding particle core via a linker.

11. The invention of claim 10, wherein the elastomer comprises at least one of polybutadiene, polyisoprene, polyisobutylene, and polyurethane.

12. The invention of claim 10, wherein the linker is a phosphonate group, a silyl group, or a carboxylic group.

13. The invention of claim 10, wherein the electroactive material has an elastic modulus that does not exceed an elastic modulus of the elastomer by more than about 100%.

14. The invention of claim 1, wherein one or more of said strands are chemically bonded to the particle core.

15. The invention of claim 1, wherein said thickness decreases in response to said voltage application.

16. An electroactive material, comprising a plurality of particle cores, each particle core surrounded by a covering having one or more strands of an elastomeric polymer, the particle cores having linear dimensions smaller than about 0.5 micron, wherein:
   each polymer strand comprises an elastomer, which is chemically bonded to the corresponding particle core via a linker; and
   the elastomer comprises at least one of polybutadiene and polyisoprene.

17. The invention of claim 16, wherein:
   the electroactive material has a dielectric constant greater than about 10;
   the particle cores comprise a material having a dielectric constant of at least about 30;
   the particle cores occupy at least about 10% of the total volume in the electroactive material; and
   the particle cores have sizes between about 10 and 100 nm.

18. The invention of claim 16, wherein:
   the particle cores comprise at least one of a metal niobate, a metal oxide, a metal titanate, a metal tantalite, a metal sulfide, a metal selenide, and a metal telluride;
   the elastomer further comprises at least one of polyisobutylene and polyurethane;
   the linker is a phosphonate group, a silyl group, or a carboxylic group; and
   the electroactive material has an elastic modulus that does not exceed an elastic modulus of the elastomer by more than about 100%.

19. The invention of claim 16, wherein the elastomer comprises polybutadiene.

20. The invention of claim 16, wherein the elastomer comprises polyisoprene.

21. An apparatus, comprising:
   first and second electrodes; and
   a layer of an electroactive material located between the electrodes, wherein the electroactive material comprises a plurality of particle cores, each particle core surrounded by a polymer covering having one or more strands of an elastomeric polymer, wherein:
      one or more of said strands are chemically bonded to the particle core; and
      the layer is bound in a manner that enables a layer thickness to respond to application of a voltage differential between the first and second electrodes.

22. The invention of claim 21, wherein said thickness decreases in response to said voltage application.

* * * * *